(12) United States Patent
Hannan et al.

(10) Patent No.: US 10,738,985 B2
(45) Date of Patent: Aug. 11, 2020

(54) HOUSING FOR LIGHT SOURCE

(71) Applicants: STMICROELECTRONICS (RESEARCH & DEVELOPMENT) LIMITED, Marlow, Buckinghamshire (GB); STMICROELECTRONICS (GRENOBLE 2) SAS, Grenoble (FR)

(72) Inventors: Joseph Hannan, Aberdeen (GB); Stuart Robertson, Perth (GB); Romain Coffy, Voiron (FR); Jean-Michel Riviere, Froges (FR)

(73) Assignees: STMICROELECTRONICS (RESEARCH & DEVELOPMENT) LIMITED, Marlow (GB); STMICROELECTRONICS (GRENOBLE 2) SAS, Grenoble (FR)

(*) Notice: Subject to any disclaimer, the term of this patent is extended or adjusted under 35 U.S.C. 154(b) by 0 days.

(21) Appl. No.: 16/439,308

(22) Filed: Jun. 12, 2019

(65) Prior Publication Data
US 2019/0376676 A1   Dec. 12, 2019

(30) Foreign Application Priority Data

Jun. 12, 2018 (FR) .................... 18 55132
Aug. 31, 2018 (FR) .................... 18 57833

(51) Int. Cl.
| | |
|---|---|
| F21V 21/00 | (2006.01) |
| F21V 23/04 | (2006.01) |
| F21V 23/00 | (2015.01) |
| H01L 23/00 | (2006.01) |
| F21K 9/20 | (2016.01) |

(Continued)

(52) U.S. Cl.
CPC ............. *F21V 23/04* (2013.01); *F21K 9/20* (2016.08); *F21V 23/006* (2013.01); *H01L 24/32* (2013.01); *H01L 33/44* (2013.01); *H05B 45/00* (2020.01); *H01L 2924/12042* (2013.01)

(58) Field of Classification Search
CPC .......... F21V 23/04; F21V 23/006; F21K 9/20; H05B 45/00; H01L 24/32; H01L 33/44; H01L 2924/12042
USPC .................................... 362/257, 311.02, 362
See application file for complete search history.

(56) References Cited

U.S. PATENT DOCUMENTS

| | | |
|---|---|---|
| 6,778,574 B1 | 8/2004 | Shimonaka et al. |
| 6,816,523 B1 | 11/2004 | Glenn et al. |

(Continued)

FOREIGN PATENT DOCUMENTS

| | | |
|---|---|---|
| DE | 102017207224 A1 | 10/2018 |
| EP | 1746692 A2 | 1/2007 |

(Continued)

OTHER PUBLICATIONS

Ablestik, Technical Data Sheet, Ablebond 8387B, Jul. 2010, 2 pages.

*Primary Examiner* — Laura K Tso
(74) *Attorney, Agent, or Firm* — Seed Intellectual Property Law Group LLP

(57) ABSTRACT

The disclosure concerns a housing for a light source mounted on a substrate, the housing comprising: a molded body having an opening permitting the passage of a light beam generated by the light source; one or more surfaces for receiving a diffuser; and first and second conducting pins traversing the molded body.

20 Claims, 2 Drawing Sheets

(51) Int. Cl.
*H01L 33/44* (2010.01)
*H05B 45/00* (2020.01)

(56) References Cited

U.S. PATENT DOCUMENTS

| | | | | |
|---|---|---|---|---|
| 8,672,517 B2* | 3/2014 | Chung | ..................... | F21K 9/00 |
| | | | | 362/294 |
| 8,770,774 B2* | 7/2014 | Ye | ..................... | F21V 33/0096 |
| | | | | 362/235 |
| 9,086,209 B2 | 7/2015 | Park et al. | | |
| 10,066,808 B2* | 9/2018 | Fernando | ................ | F21V 29/77 |
| 10,290,993 B2 | 5/2019 | Chen et al. | | |
| 2005/0190553 A1 | 9/2005 | Lynch et al. | | |
| 2005/0226636 A1 | 10/2005 | Hiramatsu et al. | | |
| 2005/0254246 A1* | 11/2005 | Huang | .................... | F21V 15/01 |
| | | | | 362/362 |
| 2007/0085101 A1 | 4/2007 | Kim | | |
| 2009/0321774 A1 | 12/2009 | Ishi et al. | | |
| 2010/0073907 A1 | 3/2010 | Wanninger et al. | | |
| 2012/0051056 A1* | 3/2012 | Derks | .................... | F21V 15/01 |
| | | | | 362/257 |
| 2013/0163627 A1 | 6/2013 | Seurin et al. | | |
| 2015/0009682 A1* | 1/2015 | Clough | ................... | F21V 13/02 |
| | | | | 362/311.02 |
| 2015/0117010 A1* | 4/2015 | Auen | ................ | G02B 19/0061 |
| | | | | 362/257 |
| 2015/0292724 A1 | 10/2015 | Griffoni et al. | | |
| 2015/0330616 A1* | 11/2015 | Preuschl | ................... | F21V 3/02 |
| | | | | 362/362 |
| 2015/0338079 A1* | 11/2015 | Preuschl | ................... | F21V 23/06 |
| | | | | 362/362 |
| 2015/0369456 A1* | 12/2015 | Creusen | ................ | F21V 17/002 |
| | | | | 362/257 |
| 2018/0014377 A1 | 1/2018 | Steinkamp et al. | | |
| 2019/0376667 A1* | 12/2019 | Coffy | ..................... | F21V 25/04 |

FOREIGN PATENT DOCUMENTS

| | | |
|---|---|---|
| EP | 2677237 A2 | 12/2013 |
| EP | 2942561 A1 | 11/2015 |
| WO | 2017/210078 A1 | 12/2017 |

* cited by examiner

HOUSING FOR LIGHT SOURCE

BACKGROUND

Technical Field

The present disclosure relates to the field of electronic devices comprising light sources, and in particular to a housing for a light source mounted on a substrate.

Description of the Related Art

For certain applications, electronic devices may comprise light sources. For example, ranging devices, such as proximity sensors, often use lasers to generate light beams aimed at one or more objects in an image scene, and the reflected light is used to determine the distance of the object from the ranging device.

The power and type of the light source will depend on the specific application, but generally the higher the power and the narrower the light beam, the greater the distance that can be measured.

The light source used to generate the light beam is generally covered by a diffuser that spreads the beam and thereby reduces to some extent its intensity. As such, the light beam is generally not considered harmful to the user. However, if the diffuser is dismounted, broken, or otherwise removed from the device, the intensity of the light source may be such that it risks causing harm, for example to a user's eyes.

There is a desire for a technical solution for reducing the risk of harm in electronic devices comprising such light sources.

BRIEF SUMMARY

One or more embodiments are directed to a housing for a light source mounted on a substrate, the housing comprising: a molded body having an opening permitting the passage of a light beam generated by the light source; one or more surfaces for receiving a diffuser; and first and second conducting pins traversing the molded body, each pin exposed at one of said surfaces.

According to one embodiment, at least one of the first and second pins has a uniform cross-section along its length.

According to one embodiment, the molded body is over-molded around at least one of the first and second pins.

According to one embodiment, at least one of the first and second pins is push-fitted into the molded body and has a uniform cross-section along its length except at one end where it has a head of increased diameter, an inside surface of the head abutting a surface of the molded body.

According to one embodiment, the molded body is formed of plastic or resin and first and second conducting pins are formed of a metal.

According to one embodiment, the housing further comprises a diffuser fixed to the molded body, the diffuser comprising a partially transparent zone permitting the transmission of the light beam and a conductive coating comprising one or more conductive tracks electrically connecting the first and second pins.

According to one embodiment, the conductive coating comprises at least one of copper, tungsten and gold.

According to one embodiment, the conductive coating comprises ITO (Indium Tin Oxide).

According to a further aspect, there is provided an electronic device comprising a substrate having mounted thereon: a light source; and the above housing covering the light source. According to one embodiment, the electronic device further comprises a circuit configured to supply a supply voltage to the light source via the first and second conducting pins.

According to one embodiment, the electronic device further comprises a circuit configured to supply a supply voltage to the light source via a switch controlled by an activation signal provided via the first and second conducting pins.

According to one embodiment, the electronic device further comprises a circuit configured to detect a detachment of the diffuser from the moulded body based on a voltage drop across the first and second conducting pins and to deactivate the light source if the detachment of the diffuser is detected.

According to a further aspect, there is provided a method of forming the above housing, the method comprising: over-molding the body of the housing around the first and second conductive pins.

According to a further aspect, there is provided a method of forming the above housing, the method comprising: molding the body to comprise first and second through-holes; and
push-fitting the first and second conductive pins into the first and second through-holes respectively.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the present disclosure, the term "connected" is used to designate a direct electrical connection between circuit elements, whereas the term "coupled" is used to designate an electrical connection between circuit elements that may be direct, or may be via one or more intermediate elements such as resistors, capacitors, transistors or buffers. Unless indicated otherwise, where the term "coupled" is used, the connection can be implemented by a direct connection.

The term "substantially" is used herein to designate a tolerance of plus or minus 2% of the value in question.

Throughout the present disclosure, the term "diffuser" is used to designate any element formed of a material that is relatively transparent to the wavelengths of the light beam that it is to diffuse. For example, it has a transmission rate of 90 percent or more for these wavelengths. The diffuser may be formed of a solid single material, or may be formed by assembling multiple materials, in which case only part of the diffuser may be transparent. For example, the diffuser is formed of glass or plastic. The transmission surfaces of the diffuser are for example planar. Alternatively, either or both of the transmission surfaces could be non-planar in order to perform an optical function.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Figure 1:
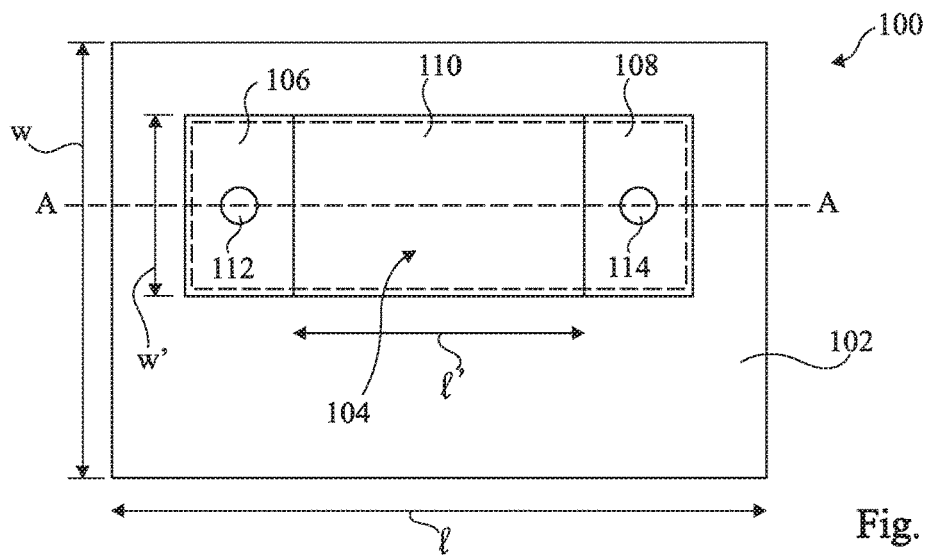
FIG. 1 is a plan view of a housing for a light source according to an example embodiment of the present disclosure.

FIG. 1 is a plan view of a housing 100 for a light source according to an example embodiment of the present disclosure. The housing 100 for example comprises a molded body 102 having an opening 104 positioned over the light source (not illustrated in FIG. 1) and permitting the light beam to exit the housing 100. In the example of FIG. 1, the opening 104 is rectangular in shape, although in alternative embodiments other shapes would be possible.

The molded body 102 for example has a length l of between 5 mm and 20 mm, and a width w of between 3 mm and 20 mm. The opening 104 for example has a length l' of between 2 mm and 10 mm, and a width w' of between 2 mm and 10 mm. The molded body 102 is for example formed of plastic or resin.

The molded body 102 further comprises surfaces 106 and 108 for receiving a diffuser 110, represented in FIG. 1 by a dashed rectangle. In the example of FIG. 1, the surfaces 106 and 108 are positioned on either side of the opening 104. Each of the surfaces 106, 108 has a surface of a conductive pin 112, 114 that is coplanar with it, as will be described in more detail below with reference to FIGS. 3 and 4.

Figure 2:
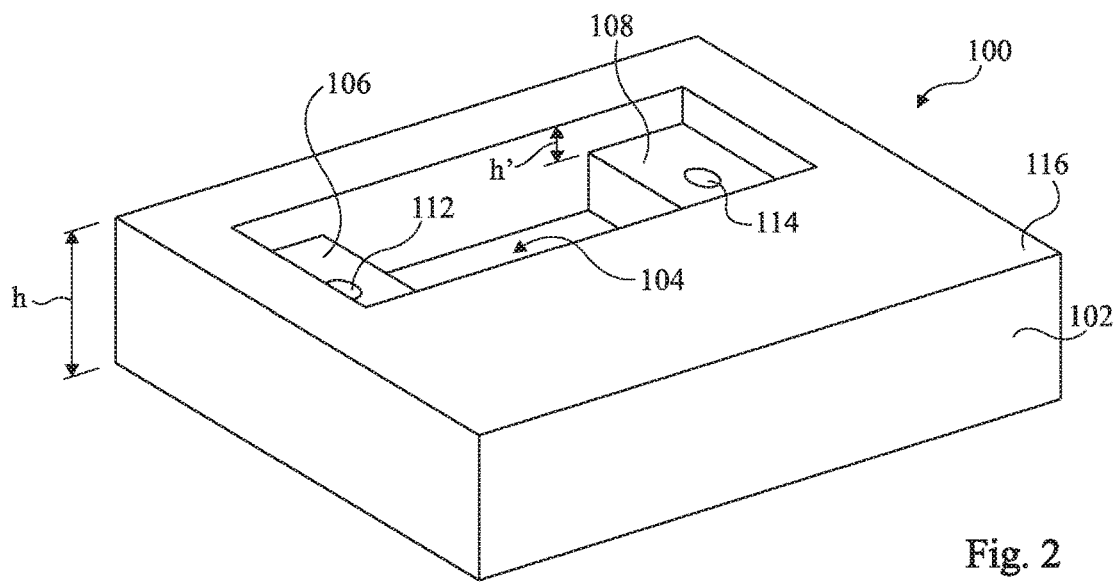
FIG. 2 is a perspective view of the housing of FIG. 1 according to an example embodiment.

FIG. 2 is a perspective view of the housing 100 without the diffuser 110. The body 102 for example has a height h of between 3 mm and 10 mm. Each of the surfaces 106, 108 is for example parallel to a top surface 116 of the housing 100. Furthermore, the surfaces 106 and 108 are for example each recessed with respect to the top surface 116 by a height h' equal to approximately the thickness of the diffuser 110. For example, the height h' is between 1 mm and 5 mm. The surfaces 106 and 108 recessed in the body 102 thus form a mounting in which the diffuser 110 can be positioned and fixed, for example with glue, the edges of which serve to align the diffuser 110. In alternative embodiments, the surfaces 106, 108 could be flush with the top surface 116 of the housing 100, and other alignment mechanisms could be provided for aligning the diffuser 110 with the body 102.

Figure 3A:
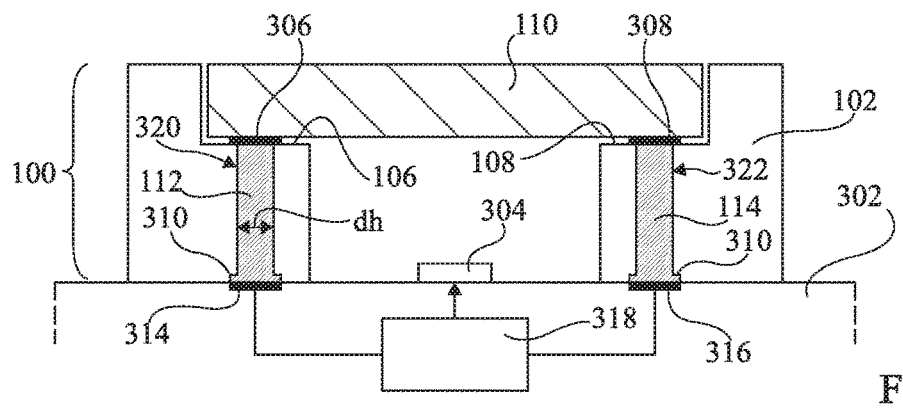
FIG. 3A is a cross-section view of the housing of FIG. 1 according to an example embodiment.

FIG. 3A is a cross-section view of the housing 100 taken along a line A-A represented in FIG. 1 passing through the body 102 and through the conductive pins 112, 114.

The housing 100 is mounted on a substrate 302 and covers a light source 304. The light source 304 is for example configured to generate a laser beam or other type of light beam having a relatively high intensity. In some embodiments, the laser beam is in the infrared or near-infrared spectrum.

A surface of the conductive pin 112 for example is coplanar with the surface 106 and makes electrical contact with a contact 306 formed on the underside 307 of the diffuser 110. Similarly, the conductive pin 114 for example makes electrical contact with a contact 308 formed on the underside 307 of the diffuser 110. In some cases, a conductive glue may be used to fix the top surfaces of the pins 112, 114 to the contacts 306, 308 respectively. While not visible in the view of FIG. 3A, the contacts 306 and 308 are for example electrically connected together by one or more conductive tracks formed on the underside of the diffuser 110.

A bottom end of each of the conductive pins 112, 114 for example comprises a head 310 of greater width than the rest of the pin. In particular, in the embodiment of FIG. 3A, the pins 112, 114 are for example inserted into the body 102 post molding, by push-fitting them such that the heads 310 contact corresponding recesses in the underside of the body 102.

An underside of the head 310 of each pin 112, 114 makes electrical contact with a corresponding pad 314, 316 formed on the surface of the substrate 302. In some cases, a conductive glue may be used to fix the undersides of the heads 310 of the pins 112, 114 to the pads 314, 316 respectively. The substrate 302 for example comprises a diffuser verification circuit 318 coupled to each of the pads 314, 316 and to the light source 304, the circuit 318 being schematically represented in block form in FIG. 3A.

The pins 112, 114 and pads 314, 316 are for example formed of copper, aluminum or of another metal or a metal alloy.

A method of forming the housing of FIG. 3A for example involves molding the body 102 in plastic or resin, including through-holes 320 and 322 suitable for receiving the pins. For example, each of the through-holes 320, 322 has a diameter dh substantially equal to the diameter of the shaft of the pins. The pins 112, 114 can then be inserted into the through-holes, and pushed in until their heads 310 make contact with the underside of the body 302. The length of the pins is for example such that when the heads 310 make contact with the underside of the body 302, their top surfaces are substantially flush with the surfaces 106 and 108 respectively, such that electrical contact can be made with the contacts 306, 308 of the diffuser 110. The diffuser 110 is then for example glued in position to the surfaces 106, 108, and in some cases a conductive glue is used to ensure an electrical connection between the tops of the pins 112, 114 and the contacts 306, 308 of the diffuser 110.

In operation, the circuit 318 for example verifies continuously or periodically the presence of an electrical connection between the pads 314 and 316 via the pins 112, 114 and via the conductive tracks on the underside 307 of the diffuser 110. If an open circuit is detected, for example because the diffuser 110 has been removed, broken or has otherwise become entirely or partially detached, the light source 304 is for example deactivated.

Figure 3B:
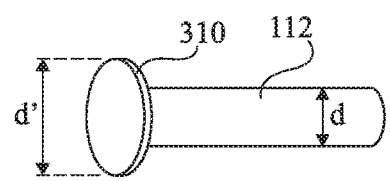
FIG. 3B is a perspective view of a pin of the housing of FIG. 3A according to an example embodiment.

FIG. 3B illustrates the conductive pin 112 of the embodiment of FIG. 3A in more detail according to an example embodiment. The pin 112 for example comprises a shaft that is substantially cylindrical in shape, and for example has a diameter d of between 1 mm and 4 mm. The head 310 for example has a diameter d' larger than the diameter d, and for example of between 2 mm and 8 mm. The pin 114 is for example similar to the pin 112.

Figure 4:
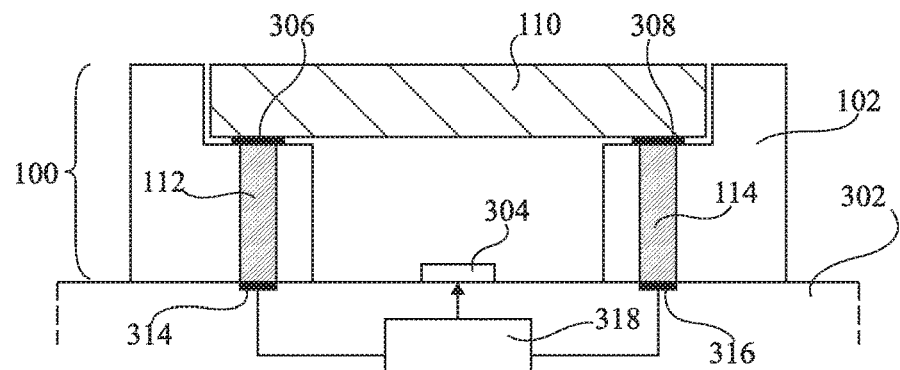
FIG. 4 is a cross-section view of the housing of FIG. 1 according to an alternative embodiment to that of FIG. 3A.

FIG. 4 is a cross-section view of the housing 100 taken along the line A-A of FIG. 1 according to an alternative embodiment to that of FIG. 3A. Like features have been labelled with like reference numerals in FIG. 4 and will not be described again in detail. In the embodiment of FIG. 4, the conductive pins 112 and 114 do not have the heads 310, and thus for example have substantially uniform cross-section along their entire length. In this embodiment, the molded body 102 is for example over-molded around the pins 112 and 114. For example, the pins are positioned within a suitable mold, and the mold is filled with plastic or resin in order to form the body 102 around the pins. In some cases, a conductive glue may be used to fix the top surfaces of the pins 112, 114 to the contacts 306, 308 respectively, and the bottom surfaces of the pins 112, 114 to the pads 314, 316 respectively.

Figure 5:
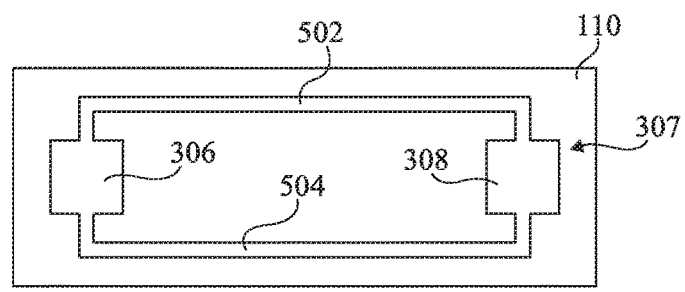
FIG. 5 is a plan view of the underside of a diffuser of the housing of FIG. 1 according to an example embodiment.

FIG. 5 is a plan view of the underside 307 of the diffuser 110 according to an example embodiment. The contacts 306 and 308 are for example square, although other shapes would be possible. In the embodiment of FIG. 5, the contacts 306 and 308 are electrically connected by a pair of conductive tracks 502 and 504 running close to the edge of the surface of the diffuser 110 so as to avoid interfering with the light beam passing through a central portion of the diffuser. The contacts 306, 308 and tracks 502, 504 are for example implemented by a same conductive coating, formed for example using a photolithography process. The conductive coating is for example of copper, gold, ITO (Indium Tin Oxide) or of another metal or a metal alloy.

Figures 6A, 6B, 6C:
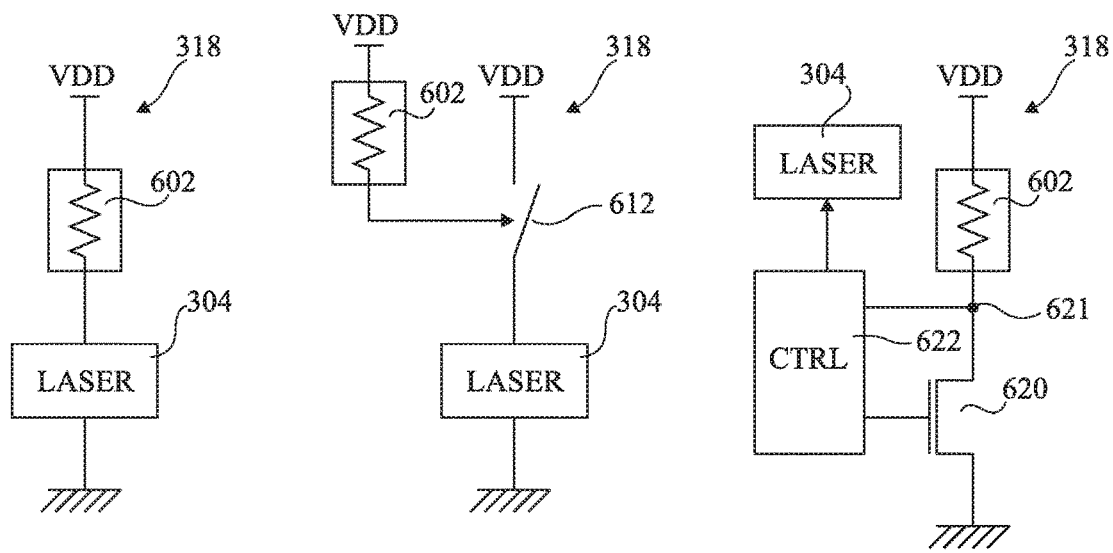
FIGS. 6A to 6C schematically alternative implementations of a circuit for detecting the detachment of a diffuser of the housing of FIG. 1.

FIGS. 6A, 6B and 6C schematically illustrate alternative implementations of the circuit 318. In the example of FIG. 6A, the circuit 318 couples the light source (LASER) 304 to a supply voltage rail VDD via a conductive loop 602 formed by the conduction pins 112, 114, contacts 306, 308 and conductive tracks 502, 504 (represented by a resistance in FIGS. 6A to 6C). The resistance of this conductive loop 602 when the diffuser 110 is correctly in place is for example configured to be of 6 ohms or less, and in some embodiments of 3 ohms or less. If, however, the diffuser 110 becomes detached causing an open circuit in the conductive loop, the light source 304 will be disconnected from the supply voltage.

In the example of FIG. 6B, the circuit 318 comprises a switch 612 controlled by an activation signal received via the conductive loop 602. The activation signal is for example the supply voltage VDD. The switch 612 couples the light source 304 to the supply voltage rail VDD. Under normal conditions, the conductive loop 602 supplies the voltage VDD to the switch 612, which is thus conducting and causes the light source 304 to be activated. If, however, the diffuser 110 becomes detached causing an open circuit in the conductive loop, the switch 612 will be rendered non-conducting, thereby deactivating the light source 304.

An advantage of the embodiment of FIG. 6B with respect to the embodiment of FIG. 6A is that the current flowing through the conductive loop 602 is relatively low, leading to low power consumption.

In the example of FIG. 6C, the circuit 318 comprises a transistor 620, for example an NMOS transistor, coupled in series with the conductive loop 602 between the supply voltage rail VDD and the ground rail. An intermediate node 621 between the conductive loop 602 and the transistor 620 is coupled to a control circuit (CTRL) 622, which also controls the gate of the transistor 620 and the light source 304.

In operation, the control circuit 622 for example periodically activates the transistor 620, causing a current to flow through the conductive loop 602 if it is not in open circuit. The voltage at the node 621 will thus rise towards the supply voltage VDD, which can be detected by the control circuit 622, and cause the control circuit to activate the light source, or maintain the activation of the light source if it is already on. If, however, the control circuit 622 detects that the voltage at the node 621 does not rise towards the supply voltage VDD when the transistor 620 is activated, this indicates an open circuit in the conductive loop 602, and the control circuit 622 is configured to deactivate the light source 304 in response.

Figure 7:
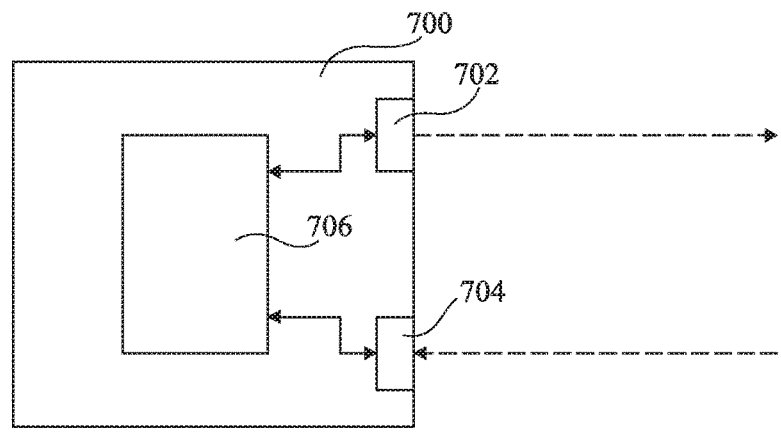
FIG. 7 schematically illustrates an electronic device comprising a light source according to an example embodiment of the present disclosure.

FIG. 7 schematically illustrates an electronic device 700 comprising a light source module 702 comprising a light source mounted on a substrate and housed in a housing as described herein above. The device 700 is for example a ranging device or imaging device capable of capturing one or more ranges and/or a depth map of the image scene. The device 700 for example comprises an image sensor 704 formed of an array of SPADs (Single Photon Avalanche Diodes) or of other types of depth sensing elements. The image sensor is for example configured to receive the light generated by the light source module 702 after reflection by one or more objects in the image scene. The light source module 702 and image sensor 704 are for example coupled to a processing device 706 configured to control the laser beam emitted into the image scene by the module 702 and to process readings from the image sensor 704 in order to extract one or more ranges and/or a depth map.

The device 700 is for example a ranging device, a 3D digital camera, a webcam, a mobile telephone or smart phone, or other device having a ranging capability.

An advantage of the embodiments described herein is that they provide a relatively low cost and effective solution for detecting whether a diffuser has become detached from a housing of a light source. In particular, by providing pins traversing a molded body, a conductive loop can be established that passes through the pins and through an element of the diffuser and permits the light source to be deactivated in the case of detachment of the diffuser. Furthermore, providing pins that traverse through the molded body provides advantages in terms of security, as the pins are not accessible at the exterior of the housing. Indeed, the glass or molded body of the housing would have to be broken to access the pins.

Having thus described at least one illustrative embodiment, various alterations, modifications and improvements will readily occur to those skilled in the art. For example, while an example of the electrical connection crossing the diffuser has been described with reference to FIG. 5, alternative implementations would be possible. Furthermore, the circuit described in relation with FIG. 6 is merely an example, and other circuits could be used.

Furthermore, it will be apparent to those skilled in the art that the various features described in relation with the various embodiments could be combined, in alternative embodiments, in any combination. For example, it will be apparent to those skilled in the art that the circuit of FIG. 6 could be used in combination with either of the embodiments of FIGS. 3A and 4.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A housing for a light source mounted on a substrate, the housing comprising:
a molded body having an opening configured to permit passage of a light beam generated by the light source;

a recessed portion of the molded body configured to receive a diffuser; and first and second conducting pins extending through the molded body, surfaces of the first and second conducting pins exposed at the recessed portion.

2. The housing of claim 1, wherein at least one pin chosen among the first and second conducting pins has a uniform cross-section along its length.

3. The housing of claim 1, wherein the molded body is formed of at least one material chose among plastic and resin, and wherein the first and second conducting pins are formed of a metal.

4. The housing of claim 1, further comprising the diffuser fixed to the one or more surfaces of the molded body, wherein the diffuser comprises a partially transparent zone permitting transmission of a light beam and a conductive coating comprising one or more conductive tracks electrically connecting the first and second conductive pins.

5. The housing of claim 4, wherein the conductive coating comprises at least one material chose among copper, tungsten, and gold.

6. The housing of claim 4, wherein the conductive coating comprises ITO (Indium Tin Oxide).

7. An electronic device, comprising:
a substrate having a first surface;
a light source coupled to the first surface, the light source configured to generate a light beam;
a diffuser; and
a housing coupled to the first surface and covering the light source, the housing including:
a through opening configured to permit passage of the light beam;
a receiving surface, the diffuser coupled to the receiving surface; and
first and second conductive pins extending through the housing, wherein the diffuser is coupled to the first and second conductive pins.

8. The electronic device of claim 7, further comprising first and second contacts coupled to ends of first and second conductive pins, respectively, wherein the first and second contacts couple the first and second conductive pins to the diffuser.

9. The electronic device of claim 7, wherein the housing includes a recess, wherein the receiving surface is formed at a bottom surface of the recess.

10. The electronic device of claim 7, further comprising a circuit coupled to the first and second conductive pins.

11. The electronic device of claim 10, wherein the circuit is located in the substrate.

12. The electronic device of claim 10, wherein the circuit is configured to supply a supply voltage to the light source through the first and second conducting pins.

13. The electronic device of claim 7, further comprising a circuit configured to supply a supply voltage to the light source through a switch that is controlled by an activation signal provided by the first and second conducting pins.

14. The electronic device of claim 7, further comprising a circuit configured to detect a detachment of the diffuser from the housing based on a voltage drop across the first and second conducting pins and to deactivate the light source when detachment of the diffuser is detected.

15. A method, comprising:
coupling first and second conductive pins to first and second contacts, respectively, on a surface of a substrate, the substrate including a diffuser verification circuit, wherein the first and second pins are electrically coupled to the diffuser verification circuit; and
molding a housing around the first and second conductive pins.

16. The method of claim 15, further comprising:
coupling a light source to the surface of the substrate; and
coupling a diffuser to a surface of the housing and to the first and second conductive pins, the diffuser covering a through opening in the housing and the light source.

17. The method of claim 16, further comprising:
prior to coupling the diffuser, forming conductive coating layers on surfaces of the first and second conductive pins,
wherein coupling the diffuser comprises coupling the diffuser to the conductive coating layers.

18. A method, comprising:
molding a housing on a surface of a substrate, the housing including first and second through holes that exposes first and second contacts on the surface of the housing, the substrate including a diffuser verification circuit that is coupled to the first and second contacts; and
inserting first and second conductive pins into the first and second through holes, respectively, such that the first and second pins are electrically coupled to the first and second contacts, respectively.

19. The method of claim 18, further comprising:
coupling a light source to the surface of the substrate; and
coupling a diffuser to a surface of the housing and to the first and second conductive pins, the diffuser covering a through opening in the housing and the light source.

20. The method of claim 18, further comprising:
prior to coupling the diffuser, forming conductive coating layers on surfaces of the first and second conductive pins,
wherein coupling the diffuser comprises coupling the diffuser to the contacts.

* * * * *